United States Patent
Okuyama et al.

(10) Patent No.: US 7,135,348 B2
(45) Date of Patent: Nov. 14, 2006

(54) SEMICONDUCTOR LIGHT EMITTING DEVICE AND FABRICATION METHOD THEREOF

(75) Inventors: Hiroyuki Okuyama, Kanagawa (JP); Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 10/345,625

(22) Filed: Jan. 16, 2003

(65) Prior Publication Data

US 2003/0141508 A1 Jul. 31, 2003

(30) Foreign Application Priority Data

Jan. 18, 2002 (JP) ............................ P2002-009892

(51) Int. Cl.
| | |
|---|---|
| H01L 21/00 | (2006.01) |
| H01L 21/20 | (2006.01) |
| H01L 21/36 | (2006.01) |
| H01L 21/44 | (2006.01) |
| H01L 31/0328 | (2006.01) |

(52) U.S. Cl. ..................... 438/47; 438/46; 438/44; 438/47; 438/481; 438/680; 257/190; 257/79; 257/96

(58) Field of Classification Search ............ 438/481, 438/46, 680, 681, 44, 47; 257/97, 99, 190, 257/79, 96
See application file for complete search history.

(56) References Cited

U.S. PATENT DOCUMENTS

| | | | |
|---|---|---|---|
| 4,400,411 A | * | 8/1983 | Yuan et al. ................. 438/400 |
| 4,526,624 A | | 7/1985 | Tombrello et al. |
| 6,030,849 A | | 2/2000 | Hasegawa et al. |
| 6,110,813 A | | 8/2000 | Ota et al. |

(Continued)

FOREIGN PATENT DOCUMENTS

JP 09-199419 7/1997

(Continued)

OTHER PUBLICATIONS

Kazumasa et al. (Crystalline and optical properties of ELO GaN by HVPE using Tungsten Mas, IEICE Trans. Electron. vol. E83-C, No. 4, Apr. 2000, pp. 620-626.*

(Continued)

*Primary Examiner*—Douglas W. Owens
*Assistant Examiner*—Samuel Gebremariam
(74) *Attorney, Agent, or Firm*—Robert J. Depke; Rockey, Depke, Lyons & Kitzinger LLC

(57) ABSTRACT

A semiconductor light emitting device is fabricated by forming a mask having an opening on a substrate, forming a crystal layer having a tilt crystal plane tilted from the principal plane of the substrate by selective growth from the opening of the mask, and forming, on the crystal layer, a first conductive type layer, an active layer, and a second conductive type layer, which extend within planes parallel to the tilt crystal plane, and removing the mask. The semiconductor light emitting device can be fabricated without increasing fabrication steps while suppressing threading dislocations extending from the substrate side and keeping a desirable crystallinity. The semiconductor light emitting device is also advantageous in that since deposition of polycrystal on the mask is eliminated, an electrode can be easily formed, and that the device structure can be finely cut into chips.

13 Claims, 10 Drawing Sheets

U.S. PATENT DOCUMENTS

| | | | |
|---|---|---|---|
| 6,111,277 | A | 8/2000 | Ikeda |
| 6,252,261 | B1 | 6/2001 | Usui et al. |
| 6,274,889 | B1 | 8/2001 | Ota et al. |
| 6,316,357 | B1 | 11/2001 | Lin et al. |
| 6,320,209 | B1 * | 11/2001 | Hata et al. .................. 257/190 |
| 6,403,451 | B1 | 6/2002 | Linthicum et al. |
| 6,576,571 | B1 | 6/2003 | Biwa et al. |
| 6,583,445 | B1 | 6/2003 | Reedy et al. |
| 6,586,778 | B1 | 7/2003 | Linthicum et al. |
| 6,610,144 | B1 | 8/2003 | Mishra et al. |

FOREIGN PATENT DOCUMENTS

| | | |
|---|---|---|
| JP | 10-256151 | 9/1998 |
| JP | 10-265297 | 10/1998 |
| JP | 10-270801 | 10/1998 |
| JP | 10-312971 | 11/1998 |
| JP | 10-321910 | 12/1998 |
| JP | 11-238687 | 8/1999 |
| JP | 2000-012976 | 1/2000 |
| JP | 2000-150391 | 5/2000 |

OTHER PUBLICATIONS

Wei Yang et al. "Single Crystal GaN pyramids grown on (111) Si substrates by selective lateral overgrowth" Journal of Crystal Growth 204 (1999) pp. 270-274.

Raj Singh et al. "Selective Area Growth of GaN Directly on (0001) Sapphire by the HVPE Technique" MRS Internet Journal Nitride Semiconductor Research, The Materials Research Society (received Jun. 22, 1998, accepted Aug. 24, 1998).

J. Wang et al. "Fabrication of nanoscale structures of InGaN by MOCVD lateral overgrowth" Journal of Crystal Growth 197 (1999) pp. 48-53.

Zhigang Mao et al. "Defects in GaN Pyramids Grown on Si (111) Substrates by Selective Lateral Overgrowth" Honeywell Technology Center Research Paper.

D. Kapolnek et al. "Spatial control of InGaN luminescence by MOCVD selective epitaxy" Journal of Crystal Growth (1998) pp. 180-190.

Takao Someya et al. "Gallium-nitride-based lasers in the next generation" OYO Buturi, vol. 69, No. 10, pp. 1196-1199 (2000).

* cited by examiner

SEMICONDUCTOR LIGHT EMITTING DEVICE AND FABRICATION METHOD THEREOF

This application claims priority to Japanese Patent Application Number JP2002-009892 filed Jan. 18, 2002, which is incorporated, herein by reference.

BACKGROUND OF THE INVENTION

The present invention relates to a light emitting device having a double-hetero structure including a first conductive type layer, an active layer, and a second conductive type layer stacked to each other, and to a method of fabricating the semiconductor light emitting device.

Various types of semiconductor light emitting devices are known. One of these types is configured by forming a low-temperature buffer layer overall on a sapphire substrate, forming an n-side contact layer made from Si-doped GaN on the low-temperature buffer layer, and stacking, on the n-side contact layer, an n-side cladding layer made from Si-doped GaN, an active layer made from Si-doped InGaN, a p-side cladding layer made from Mg-doped AlGaN, and a p-side contact layer made from Mg-doped GaN. Semiconductor light emitting devices having such a configuration have been commercially available in large quantities as blue or green LEDs (Light Emitting Diodes) for emission of light of blue or green, specifically, having wavelengths ranging from 450 nm to 530 nm.

In the case of forming a gallium nitride layer for fabricating a semiconductor light emitting device, crystal of gallium nitride is often grown on a sapphire substrate. In particular, a sapphire substrate with the C-plane taken as the principal plane of the substrate is used for growing crystal of gallium nitride thereon. In this case, the plane of the gallium nitride layer formed on the principal plane of the sapphire substrate also has the C-plane, and an active layer and cladding layers sandwiching the active layer, which are formed on planes parallel to the principal plane of the substrate, necessarily extend in planes parallel to the C-plane. The semiconductor light emitting device having such a structure that respective crystal layers are stacked in parallel to the principal plane of the substrate can obtain flatness required to form electrodes by making use of the flatness of the principal plane of the substrate.

The above-described technique for growing crystal of gallium nitride on a sapphire substrate, however, has a disadvantage that dislocations may densely exist in the crystal of gallium nitride due to lattice mismatch between the sapphire substrate and the crystal of gallium nitride grown thereon.

To solve such a disadvantage, an attempt has been made to form a low-temperature buffer layer on a substrate and grow crystal of gallium nitride thereon for suppressing crystal defects of the crystal of gallium nitride.

Japanese Patent Laid-open No. Hei 10-312971 discloses a technique of combining the formation of a low-temperature-buffer layer with epitaxial lateral overgrowth (ELO) for reducing crystal defects.

Japanese Patent Laid-open No. Hei 10-321910 discloses a semiconductor light emitting device configured by forming a hexagonal prismatic structure having a side plane composed of the (10-10) plane or the (1-100) plane [M-plane] perpendicular to the principal plane of a substrate, and forming a light emission region on the hexagonal prismatic structure in such a manner that the region extends in the direction perpendicular to the principal plane of the substrate. With this configuration, since an active layer and the like forming the light emission region extend in the direction perpendicular to the principal plane of the substrate, it is possible to suppress crystal defects and dislocations due to lattice mismatch with the substrate, and to reduce strain due to difference in thermal expansion coefficient therebetween.

The technique forming the hexagonal prismatic structure extending in the direction perpendicular to the principal plane of a substrate disclosed in Japanese Patent Laid-open No. Hei 10-321910, however, has the following problem. In this technique, after being formed by a hydride vapor phase epitaxy (HVPE) process, a layer structure is subjected to dry etching for obtaining the side plane composed of the (10-10) plane or the (1-101) plane [M-plane]. In general, such dry etching necessarily damages the crystal plane. Accordingly, this technique has a disadvantage that characteristics of the crystal is degraded by dry etching, although it has an advantage in suppressing threading dislocations extending from the substrate side. Another disadvantage is that since dry etching is additionally performed, the number of steps is increased.

In the case of forming a crystal layer on the $C^+$-plane of a sapphire substrate by selective growth, the crystal growth has a tapered shape surrounded by the (1-101) plane, that is, the S-plane (for example, see Paragraph 0009 in Specification of Japanese Patent No. 2830814). This technique, however, has a disadvantage that a flat plane required to form electrodes is not obtained. Such a structure, therefore, has not been positively used for electronic devices or light emitting devices, and used only as an underlying layer for selective growth of a crystal structure.

To fabricate devices of a type including layers extending within planes parallel to the principal plane of a substrate, it is important to form each flat plane for keeping desirable crystallinity, and therefore, the device structure tends to have electrodes and the like extending in the horizontal direction. Accordingly, in the case of separating the devices from each other, the device structure must be cut into chips by a dicer, with a result that it takes a lot of time to cut the device structure into chips and further it is very difficult to cut the device structure into chips while avoiding electrodes and the like spread in the horizontal direction. Also, since a sapphire substrate and a nitride such as GaN are too hard to cut, dicing of the device structure, that is, the sapphire substrate and the nitride requires a cutting allowance of at least about 20 µm. This makes it even more difficult to cut the device structure into the micro-sized chips.

Light emitting devices of a type, which is configured by forming an active layer made from a gallium nitride based material on a plane parallel to the principal plane of a substrate with the $C^+$-plane taken as the principal plane of the substrate, has the following problem. Since Ga has only one bond to nitrogen atoms on the $C^+$-plane, nitrogen atoms are liable to dissociate from the crystal plane parallel to the $C^+$-plane, thereby failing to increase an effective V/III ratio. As a result, the crystallinity for forming the light emitting device is insufficient to improve the performance thereof.

SUMMARY OF THE INVENTION

An object of the present invention is to provide a semiconductor light emitting device fabricated without increasing the fabrication steps while suppressing threading dislocations extending from a substrate side and keeping desirable crystallinity, and allowing formation of a micro-sized chip.

Another object of the present invention is to provide a fabrication method capable of fabricating a semiconductor light emitting device without increasing fabrication steps while keeping desirable crystallinity, and allowing formation of a micro-sized chip.

To achieve the above object, according to a first aspect of the present invention, there is provided a semiconductor light emitting device including a crystal layer formed on a substrate, the crystal layer having a tilt crystal plane tilted from the principal plane of the substrate, and a first conductive type layer, an active layer, and a second conductive type layer, which are formed on the crystal layer in such a manner as to extend within planes parallel to the tilt crystal plane, wherein the crystal layer is formed by selective growth via an opening formed in a mask, and after formation of the crystal layer, the mask is removed.

Since the crystal layer having the tilt crystal plane tilted from the principal plane of the substrate is formed, it is possible to suppress threading dislocations extending from the substrate, and since the tilt crystal plane tilted from the principal plane of the substrate is easy to be formed by selective growth, it is possible to form the crystal layer having a desirable crystallinity without any additional step such as etching.

Since the mask for selective growth is removed, it is possible to roughly set the alignment accuracy for forming electrodes, and since the mask is removed, it is possible to prevent occurrence of an inconvenience that polycrystal is deposited.

By performing re-growth by using the substrate from which the mask has been removed, light emitting devices for emission of different colors can be fabricated. As a result, it is possible to fabricate an image display unit having a new structure.

In particular, in the case of forming the crystal layer made from gallium nitride (GaN) on the tilt crystal plane, the number of bonds from nitrogen atoms to gallium atoms in the crystal layer is larger than that in a crystal layer made from GaN formed on the $C^+$-plane, to increase an effective V/III ratio, thereby forming an active layer on a desirable crystal portion. As a result, it is possible to enhance the performance of the semiconductor light emitting device.

According to a second aspect of the present invention, there is provided a method of fabricating a semiconductor light emitting device, including the steps of forming a mask having an opening on a substrate; forming a crystal layer having a tilt crystal plane tilted from the principal plane of the substrate by selective growth from the opening of the mask, and forming, on the crystal layer, a first conductive type layer, an active layer, and a second conductive type layer, which extend within planes parallel to the tilt crystal plane; and removing the mask.

Since the crystal layer having the tilt crystal plane tilted from the principal plane of the substrate is formed, it is possible to suppress threading dislocations extending from the substrate, and since the tilt crystal plane tilted from the principal plane of the substrate is easy to be formed by selective growth, it is possible to form the crystal layer having a desirable crystallinity without any additional step such as etching.

Since the mask for selective growth is removed after growth of the crystal layer, it is possible to roughly set the alignment accuracy for forming electrodes, and since the mask is removed, it is possible to prevent occurrence of an inconvenience that polycrystal is deposited.

By performing re-growth by using the substrate from which the mask has been removed, light emitting devices for emission of different colors can be fabricated. As a result, it is possible to fabricate an image display unit having a new structure.

BRIEF DESCRIPTION OF THE DRAWINGS

These and other objects, features and advantages of the present invention will be apparent from the following description taken in connection with the accompanying drawings wherein.

DETAILED DESCRIPTION OF THE PREFERRED EMBODIMENTS

Figure 1A:
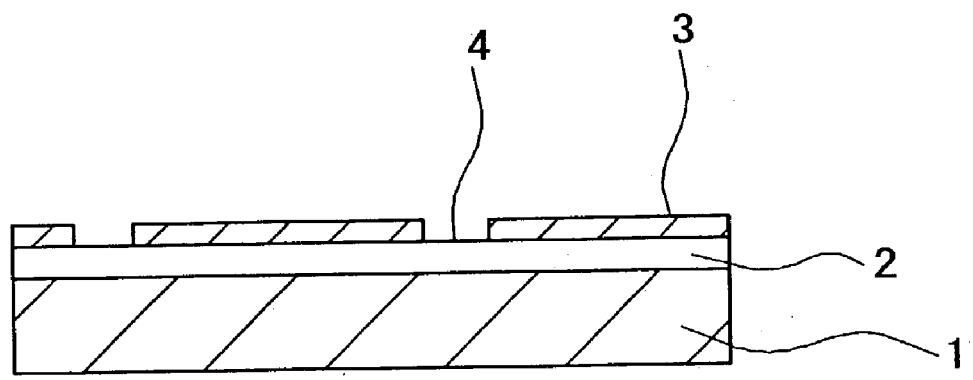
FIGS. 1A and 1B are a sectional view and a perspective view showing a mask forming step in a method of fabricating a semiconductor light emitting device according to a first embodiment of the present invention, respectively.

Hereinafter, a semiconductor light emitting device and a fabrication method thereof, to which the present invention is applied, will be described in detail.

A semiconductor light emitting device according to the present invention includes a crystal layer formed on a substrate, the crystal layer having a tilt crystal plane tilted from the principal plane of the substrate, and a first conductive type layer, an active layer, and a second conductive type layer, which are formed on the crystal layer in such a manner as to extend within planes parallel to the tilt crystal plane, wherein the crystal layer is formed by selective growth via an opening formed in a mask, and after formation of the crystal layer, the mask is removed.

The substrate used herein is not particularly limited insofar as it allows a crystal layer having a tilt crystal plane tilted from the principal plane of the substrate to be formed thereon, and may be selected from various substrates, for examples, substrates made from sapphire ($Al_2O_3$, having A-plane, R-plane, or C-plane), SiC (including 6H, 4H, and 3C), GaN, Si, ZnS, ZnO, AlN, LiMgO, GaAs, $MgAl_2O_4$, and InAlGaN. Of these substrates, hexagonal or cubic crystal based substrates are preferred, with the hexagonal substrates being most preferred.

In the case of using a sapphire substrate, the C-plane of sapphire may be taken as the principal plane of the substrate. In general, the sapphire substrate with the C-plane of sapphire taken as the principal plane thereof has been often used to grow a gallium nitride (GaN) based compound semiconductor thereon. It is to be noted that the C-plane of sapphire taken as the principal plane of the sapphire substrate is not limited to the theoretical C-plane but may be a plane tilted from the theoretical C-plane by an angle 5 to 6 degrees.

The substrate may not be a constituent of a light-emitting device as a product. In other words, the substrate may be used merely to hold a device portion and be removed before the device is accomplished.

The crystal layer formed on the substrate has a tilt crystal plane tilted from the principal plane of the substrate. The crystal layer is not particularly limited insofar as it allows a light-emitting region (to be described later) composed of a first conductive type layer, an active layer, and a second conductive type layer to be form on a plane parallel to the tilted crystal plane, tilted from the principal plane of the substrate, of the crystal layer. In general, the crystal layer is preferably made from a material having a wurtzite type crystal structure.

For example, such a crystal layer may be made from a material selected from a group III based compound semiconductor, a BeMgZnCdS based compound semiconductor, a BeMgZnCdO based compound semiconductor, a gallium nitride (GaN) based compound semiconductor, an aluminum nitride (AlN) based compound semiconductor, an indium nitride (InN) based compound semiconductor, an indium gallium nitride (InGaN) based compound semiconductor, and an aluminum gallium nitride (AlGaN) based compound semiconductor. Of these materials, a nitride semiconductor such as a gallium nitride based compound semiconductor is preferably used as the material for forming the crystal layer.

It is to be noted that according to the present invention, the nitride semiconductor expressed by InGaN, AlGaN, or GaN does not necessarily mean only InGaN, AlGaN, or GaN in the form of a strict ternary or binary mixed crystal. For example, the nitride semiconductor expressed by InGaN may contain a trace amount of Al and other impurities which do not affect the function of InGaN without departing from the scope of the present invention.

The crystal layer can be formed by a chemical vapor deposition process selected, for example, from a metal organic chemical vapor deposition (MOCVD) process including a metal organic vapor phase epitaxy (MOVPE) process, a molecular beam epitaxy (MBE) process, and a hydride vapor phase epitaxy (HVPE) process. In particular, the MOCVD process is preferred because it rapidly yields a crystal layer with a desirable crystallinity. The MOCVD method commonly employs alkyl metal compounds, such as TMG (trimethylgallium) or TEG (triethylgallium) as a Ga source, TMA (trimethylaluminum) or TEA (triethylaluminum) as an Al source, and TMI (trimethylindium) or TEI (triethylindium) as an In source. It also employs ammonia gas or hydrazine gas as a nitrogen source, and other gases as an impurity source, for example, silane gas for Si, germane gas for Ge, $Cp_2Mg$ (cyclopentadienylmagnesium) for Mg, and DEZ (diethylzinc) for Zn. In the general MOCVD process, the gases are fed to the surface of the substrate heated at about 600° C. or more, and are decomposed to form a layer of an InAlGaN based compound semiconductor by epitaxial growth.

It is preferred to form an underlying growth layer on the substrate and to form the crystal layer on the underlying growth layer.

The underlying growth layer can be formed by the same chemical vapor deposition process as that used for forming the crystal layer, for example, the metal organic chemical vapor deposition (MOCVD) process, molecular beam epitaxy (MBE) process, or hydride vapor phase epitaxy (HVPE) process.

The underlying growth layer may be made from, for example, gallium nitride or aluminum nitride, and may have a structure composed of a combination of a low-temperature buffer layer and a high-temperature buffer layer, or a combination of a buffer layer and a crystal seed layer functioning as a crystal seed.

The above structure of the underlying growth layer will be described in detail below.

If the crystal layer is formed by crystal growth from a low-temperature buffer layer, there occurs a problem that polycrystals tend to be deposited on the mask layer. To solve such a problem, a high-temperature buffer layer may be formed on the low-temperature buffer layer and then the crystal layer be formed thereon so as to be grown along a plane different from the principal plane of the substrate. With this configuration, the crystal layer with a desirable crystallinity can be formed by crystal growth.

In the case of using no crystal seed layer at the time of forming the crystal layer, the crystal layer is required to be formed by selective crystal growth from a buffer layer. At this time, however, there occurs a problem that crystal growth is liable to occur even in an anti-growth region where the crystal growth is not required. To solve such a problem, a crystal seed layer may be formed on the buffer layer and the crystal layer be formed by selective crystal growth from the crystal seed layer. With this configuration, the crystal layer can be selectively formed in a region where the crystal growth is required.

The low-temperature buffer layer is intended to relieve lattice mismatch between the substrate and a nitride semiconductor. Accordingly, if the substrate has a lattice constant close to or identical to that of a nitride semiconductor, the low-temperature buffer layer is not necessarily provided. For example, an AlN layer may be grown on an SiC substrate as a high-temperature buffer layer without lowering the growth temperature, and an AlN or GaN layer may be grown on an Si substrate as a high-temperature buffer layer without lowering the growth temperature. Even in this case, a GaN layer with a desirable crystallinity can be formed by crystal growth on the buffer layer. Additionally, in the case of using a GaN substrate, the structure without any buffer layer may be adopted.

According to the present invention, the crystal layer having a tilt crystal plane tilted from the principal plane of the substrate is formed by the selective growth process by using an opening formed in a mask.

The tilt crystal plane, tilted from the principal plane of the substrate, of the crystal layer is grown depending on the kind of the principal plane of the substrate.

If the crystal layer is grown on the (0001) plane [C-plane] as the principal plane of the substrate having the wurtzite type crystal structure, the tilt crystal plane of the crystal layer becomes one selected from the (1-100) plane [M-plane], the (1-101) plane [S-plane], the (11-20) plane [A-plane], the (1-102) plane [R-plane], the (1-123) plane [N-plane], the (11-22) plane, and crystal planes equivalent thereto. In particular, it is preferred to grow the crystal layer with the S-plane or the (11-22) plane, or the crystal plane equivalent thereto. It is to be noted that the crystal plane equivalent to the S-plane or the (11-22) plane is the crystal plane tilted from the S-plane or the (11-22) plane by an angle of 5 to 6 degrees.

In particular, the S-plane is a stable plane selectively grown on the $C^+$-plane and is therefore relatively obtainable. The S-plane is expressed by the (1-101) plane in accordance with Miller indices of a hexagonal crystal system. Just as the C-plane includes the $C^+$-plane and the $C^-$-plane, the S-plane includes the $S^+$-plane and the $S^-$-plane. In this specification, the $S^+$-plane is grown on the $C^+$-plane of GaN, and it is referred to as the S-plane unless otherwise stated. Of the S-planes, the $S^+$-plane is stable. In addition, the Miller index of the $C^+$-plane is (0001).

In the case of growing the S-plane of the crystal layer made from a gallium nitride based compound semiconductor on the $C^+$-plane of the substrate as described above, the number of bonds from Ga to N on the S-plane is 2 or 3, which number is second to that on the C-plane. Since the $C^-$-plane cannot be grown on the $C^+$-plane in practice, the number of bonds on the S-plane is the largest.

In the case of growing a wurtzite type nitride, for example, GaN based nitride on a sapphire substrate with the C-plane of sapphire taken as the principal plane thereof, if the selective growth process is not used to grow the nitride, the surface of the nitride is grown as the $C^+$-plane, whereas if the selective growth process is used to grow the nitride, the surface of the nitride can be grown as the S-plane tilted from the C-plane of the sapphire substrate.

On the $C^+$-plane, parallel to the C-plane of the substrate, of the nitride, the bond of N liable to be easily released from the plane combines with one bond of Ga, whereas on the S-plane, tilted from the C-plane of the substrate, of the nitride, the bond of N combines with at least one bond of Ga.

As a result, the V/III ratio of the nitride grown along the S-plane can be effectively increased, to advantageously improve the crystallinity of the laminated structure. In addition, according to the formation of the nitride by the selective growth process, since nitride is grown along the S-plane different from the orientation of the substrate, dislocations extending upwardly from the substrate may be bent, to advantageously reduce crystal defects of the nitride.

In the semiconductor light emitting device according to this embodiment, as described above, the crystal layer has a tilt crystal plane tilted from the principal plane of the substrate.

The structure of the crystal layer will be more fully described below.

The crystal layer may have an approximately hexagonal pyramid shape in which the tilt plane forming the pyramid shape is composed of the S-plane or a plane substantially equivalent thereto. Alternatively, the crystal layer may have a so-called approximately hexagonal truncated pyramid shape in which the tilt plane of the truncated pyramid shape is composed of the S-plane or a plane substantially equivalent thereto, and the upper flat plane of the truncated pyramid shape is composed of the C-plane or a plane substantially equivalent thereto.

Each of the approximately hexagonal pyramid shape and the approximately hexagonal truncated pyramid shape is not necessarily a perfect hexagonal shape but may be an imperfect hexagonal shape with one or more missing faces.

In a preferred embodiment, the tilt crystal plane is hexagonal and is arranged so as to be approximately symmetrical. The term "approximately symmetrical" used herein embraces not only completely symmetrical but also slightly asymmetrical.

The ridge between adjacent two crystal plane segments of the crystal layer is not necessarily a straight line. Also, each of the approximately hexagonal pyramid shape and the approximately hexagonal truncated pyramid shape may extend in straight line.

The concrete selective growth process used for selectively growing the crystal layer will be described below.

The selective growth of the crystal layer is performed by making use of an opening portion (window region) selectively formed in a mask layer formed on the underlying growth layer.

For example, if the underlying growth layer is composed of a buffer layer and a crystal seed layer, the crystal seed layer is formed on the buffer layer in such a manner as to be divided into scattered small regions each having a diameter of about 10 μm, and the crystal layer having the S-plane or the like is formed by crystal growth from each of the small regions. For example, the divided regions of the crystal seed layer may be arranged so as to be spaced from each other at intervals of a value equivalent of a margin for separation of adjacent light emitting devices. The divided small region may be formed into a shape selected from a stripe, a lattice, a circle, a square, a hexagon, a triangle, a rectangle, a rhombus, and other shapes deformed therefrom.

The mask layer may be made from silicon oxide or silicon nitride. The crystal layer having an approximately hexagonal truncated pyramid shape or an approximately hexagonal pyramid shape extending in straight line in one longitudinal direction as described above can be formed by selective crystal growth from each of stripe-shaped window regions formed in the mask layer or from each of stripe-shaped regions of the crystal seed layer. As will be described below, after a first conductive type layer, an active layer, and a second conductive type layer are formed on the crystal layer formed by selective growth from the window region, the mask layer is removed from the substrate or the underlying growth layer.

By forming, in the mask layer, the window region of a circular shape (or a hexagonal shape whose one side extends along the (1-100) direction or (11-20) direction) having a size of around 10 μm, it is possible to easily form the crystal layer having a size of about twice as large as the window region by selective growth from the window region. In the crystal layer thus formed by selective growth, since the S-plane tilted from the principal plane of the substrate has an effect of bending and blocking dislocations extending from the substrate, it is possible to reduce the density of dislocations in the crystal layer.

The present inventors have made an experiment to examine characteristics of the S-plane of a semiconductor light emitting device.

A semiconductor light emitting device was prepared by forming a crystal layer of a hexagonal truncated pyramid shape having the S-plane by selective growth, and sequentially growing an InGaN active layer and a Mg-doped layer on the S-plane of the crystal layer.

With respect to such a semiconductor light emitting device, the state of each layer grown along the S-plane was examined.

As a result of observation of the state of the S-plane by making use of cathode luminescence, it was revealed that the crystallinity of the S-plane is desirable, and therefore, the luminous efficiency on the S-plane is higher than that on the $C^+$-plane.

In particular, since the growth temperature of the InGaN active layer is in a range of 700 to 800° C., the decomposition efficiency of ammonia is low, with a result that the growth of the InGaN active layer requires a larger amount of nitrogen species. In this regard, the growth of the InGaN active layer on the S-plane is preferred. As a result of observation of the surface state of the S-plane by AFM (Atomic Force Microscopy), it was revealed that the surface state of the S-plane is a regular stepped state suitable for growth of InGaN thereon.

As a result of observation by AFM, it was also revealed that although the state of the growth surface of the Mg-doped layer is generally poor in the level observed by AFM, the Mg-doped layer can be grown along the S-plane while keeping a desirable surface state, and that the doping condition at the time of growth on the S-plane is quite different from that at the time of growth on a plane other than the S-plane.

The S-plane was further subjected to microscopic photoluminescence mapping having a resolving power of about 0.5 to 1 µm. The result showed that although the surface of the sample grown on the $C^+$-plane by the ordinary growth process has irregularities at a pitch of about 1 µm, the surface of the sample grown on the S-plane is uniform.

In addition, as a result of observation of SEM (scanning electron microscope), it was revealed that the flatness of the tilt plane of the layer grown on the S-plane obtained by the selective growth process is smoother than the flat plane of the layer grown along the $C^+$-plane obtained by the ordinary growth process.

In the case of forming a crystal layer by selective growth from a window region formed in a selective growth mask, the crystal layer is generally grown only in an area over the window region. In this case, to realize lateral growth of the crystal layer, there may be adopted a micro-channel epitaxy process. The use of the micro-channel epitaxy process allows the crystal layer to be laterally grown into a shape larger than the window region.

It is known that the lateral growth of the crystal growth by using the micro-channel epitaxy process is effective to prevent threading dislocations extending from the substrate from being propagated in the crystal layer and hence to reduce the density of dislocations in the crystal layer. The lateral growth of the crystal layer by using the micro-channel epitaxy process is also advantageous in increasing the light-emitting region, equalizing a current, avoiding concentration of current, and reducing the current density.

In the semiconductor light emitting device according to the present invention, as described above, a crystal layer having a tilt crystal plane tilted from the principal plane of a substrate is formed, and a first conductive type layer, an active layer, and a second conductive type layer are sequentially formed on the crystal layer so as to extend within planes parallel to the tilt crystal plane, tilted from the principal plane of the substrate, of the crystal layer.

The first conductive type layer is a p-type or n-type cladding layer, and the second conductive type layer is an n-type or p-type cladding layer.

For example, in the case of forming the crystal layer having the S-plane by using a gallium nitride based compound semiconductor, the n-type cladding layer made from a silicon-doped gallium nitride based compound semiconductor may be formed on the S-plane of the crystal layer, an active layer made from InGaN be formed on the n-type cladding layer, and the p-type cladding layer made from magnesium-doped gallium nitride based compound semiconductor be formed on the active layer. The semiconductor light emitting device thus produced has a so-called double-hetero structure.

The active layer may have a structure that an InGaN layer be sandwiched between AlGaN layers. Also, the active layer may be of a single bulk layer structure, or a quantum well structure such as a single quantum well (SQW) structure, a double quantum well (DQW) structure, or multiple quantum well (MQW) structure. The quantum well structure uses a barrier layer for separation of quantum wells, if necessary.

The provision of the InGaN layer as the active layer is particularly advantageous in terms of easy fabrication of the light emitting device and improvement of light emission characteristics of the light emitting device. The InGaN layer grown on the S-plane is further advantageous in that since the S-plane has a structure that nitrogen atoms are less releasable, the crystallization of InGaN on the S-plane is particularly easy and the crystallinity of InGaN formed on the S-plane is desirable.

Additionally, a nitride semiconductor has a property to become n-type conductive even in the non-doped state because of nitrogen holes occurring in crystal; however, the nitride semiconductor may be converted into an n-type semiconductor with a desirable concentration of carriers by doping an ordinary donor impurity such as Si, Ge, or Se during crystal growth of the nitride semiconductor.

A nitride semiconductor can be converted into a p-type semiconductor by doping an acceptor impurity such as Mg, Zn, C, Be, Ca, or Ba in crystal of the nitride semiconductor. In this case, to obtain a p-layer with a high carrier density, after being doped with the acceptor impurity, the nitride semiconductor may be activated, for example, by an annealing treatment performed at about 400° C. or more in an inert gas atmosphere such as a nitrogen or argon atmosphere. The activation of the nitride semiconductor may be performed by irradiating the nitride semiconductor with electron beams, microwaves, or light.

The first conductive type layer, the active layer, and the second conductive type layer can be easily formed on the crystal layer so as to extend within planes parallel to the tilt crystal plane, tilted from the principal plane of the substrate, of the crystal layer by continuously forming these layers on the tilt crystal plane of the crystal layer by crystal growth. If the crystal layer has an approximately hexagonal pyramid or approximately hexagonal truncated pyramid shape whose tilt crystal plane is the S-plane, the light emission region composed of the first conductive type layer, the active layer, and the second conductive type layer can be wholly or partially formed on the S-plane. If the crystal layer has an approximately hexagonal truncated pyramid shape, the first conductive type layer, the active layer, and the second conductive type can be formed even on an upper plane, parallel to the principal plane of the substrate, of the truncated pyramid shape.

In the case of forming the light emission region on the plane parallel to the principal plane of the substrate, light emitted from the light emission region is decayed by multiple reflection, whereas in the case of forming the light emission region on the tilt S-plane tilted from the principal plane of the substrate, light emitted from the light emission region can be emerged to the outside of the light emitting semiconductor device without occurrence of multiple reflection.

The first conductive type layer functioning as the cladding layer can be made from the same material as that of the crystal layer so as to have the same conductive type as that of the crystal layer. To be more specific, the first conductive type layer can be formed by continuing, after the crystal layer having the S-plane is formed, the crystal growth while continuously adjusting the concentration of the source gas. Alternatively, the first conductive type layer may be configured as part of the crystal layer having the S-plane. In addition, to improve the light emergence efficiency, the first conductive type layer may be formed on the plane not parallel to the principal plane of the substrate.

According to the semiconductor light emitting device in this embodiment, the luminous efficiency can be increased by making use of a desirable crystallinity of the tilt crystal plane, tilted from the principal plane, of the crystal layer. In particular, by injecting a current only into the S-plane having a desirable crystallinity, it is possible to enhance the luminous efficiency. This is because the InGaN active layer can be desirably formed on the S-plane having a desirable crystallinity. In addition, the actual area of the active layer extending within a plane being substantially parallel to the S-plane is larger than the area, projected on the principal plane of the substrate or the underlying growth layer, of the active layer. The enlarged area of the active layer makes it possible to increase the area of the light emission region of the device and thereby reduce the density of a current injected in the light emission region, and to reduce the saturated luminance and thereby increase the luminous efficiency.

With respect to the semiconductor light emitting device including the hexagonal pyramid shaped crystal layer having the tilt S-plane, the stepped state of the surface of a portion near the top of the S-plane becomes poor, so that the luminous efficiency at the top portion of the device is degraded.

To be more specific, when the S-plane section on one side of the hexagonal pyramid shape is divided into four regions (top region, left region, right region, and bottom region) with respect to a nearly central portion of the S-plane section, the stepped state is most wavy in the top region, whereby abnormal crystal growth is liable to occur in the top region. On the contrary, in each of the left and right regions, since steps extend nearly in straight line and are closely collected, the crystal growth state becomes desirable. In the bottom region, although steps are slightly wavy, crystal growth is not so abnormal as observed in the top region.

In the semiconductor light emitting device of the present invention, it is thus recommended that the injection of a current in the active layer be controlled such that the current density in the top region be smaller than that in each of the other regions. To make the current density in the top region small, an electrode may be formed not in the top region but in the side region, or a current blocking area be formed in the top region before an electrode is formed in the top region.

According to the present invention, after the crystal layer, the first conductive type layer, the active layer, and the second conductive type layer are formed via the window region of the mask layer, the mask layer is removed. According to the related art method, to form an electrode in the opening portion of the mask layer, strict positioning for forming the electrode is required; however, according to the present invention, since the mask layer is previously removed before formation of the electrode, it is possible to roughly set the alignment accuracy of the electrode as compared with the related art method, and hence to relatively simply form the electrode. Also, in the case of forming the electrode in a state that the mask layer remains, there occurs a problem associated with polycrystal deposited on the mask layer; however, according to the present invention, since the mask layer is removed, the polycrystal can be removed from the substrate.

It is preferred to remove the whole of the mask layer from the substrate; however, in the case of growing a crystal layer or the like in the lateral direction by using micro-channel expitaxy in such a manner as to extend outwardly from a window region, a portion, located at an edge portion of the window region under the crystal layer, of the mask layer cannot be perfectly removed and therefore remains. According to the present invention, it is to be understood that such a slight amount of a remaining portion of the mask layer is within an allowable range.

If the mask layer is made from $SiO_2$ or SiN, the removal of the mask layer is performed by using a hydrofluoric acid based etchant such as hydrofluoric acid or a commercial product (trade name: SO-1, produced by Kanto Chemical Co., Inc.).

An electrode is formed on each of the crystal layer and the second conductive type layer. To reduce the contact resistance, a contact layer may be formed and then the electrode be formed thereon. In the case of forming these electrodes by vapor deposition, if the p-electrode and the n-electrode adhere on both the crystal layer and the crystal seed layer, there occurs short-circuit therebetween. To cope with such an inconvenience, each of the electrodes must be accurately formed by vapor deposition.

An image display unit or an illumination unit can be fabricated by arraying a plurality of the semiconductor light emitting devices according to the present invention. In this case, according to the semiconductor light emitting device of the present invention, the electrode area can be suppressed by making use of the S-plane, and accordingly, by preparing the semiconductor light emitting devices of three primary colors and arraying them in a scannable manner, an image display unit with a reduced electrode area can be realized.

In particular, since crystal is re-grown by re-using the substrate exposed by removal of the mask layer, another light emitting device can be further formed on the same substrate. Accordingly, by forming a semiconductor light emitting devices for emission of light of three primary colors on the same substrate, it is possible to provide an image display unit having a new structure.

Hereinafter, embodiments to which the present invention is applied will be described with reference to the drawings. In each embodiment, a semiconductor light emitting device having a configuration according to the present invention and a display unit using the device are fabricated in accordance with a fabrication method according to the present invention. Accordingly, in each embodiment, description of the fabrication steps will be first performed, followed by description of a device and a display unit fabricated by the fabrication steps.

<Embodiment 1>

In this embodiment, a semiconductor light emitting device is formed by growing a hexagonal pyramid shaped crystal layer having a size larger than a selective mask portion, that is, a window region. A process of fabricating such a semiconductor light emitting device will be described, together with a device structure thereof, with reference to FIGS. 1A to 7.

Figure 1B:
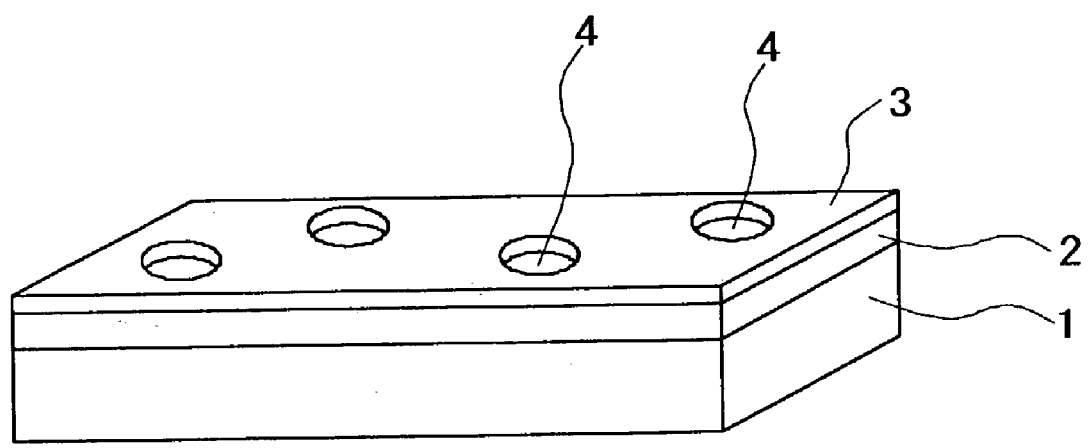

A low temperature buffer layer is formed on a sapphire substrate 1 with the $C^+$-plane taken as the principal plane thereof, and the temperature is raised to 1000° C., at which a silicon-doped GaN layer 2 is formed as a first growth layer on the buffer layer. A mask layer 3 made from $SiO_2$ or SiN is formed overall on the GaN layer 2 to a thickness of 100 to 500 nm, and then as shown in FIGS. 1A and 1B, window regions 4 composed of circular openings each having a diameter of about 10 μm are formed in the mask layer 3 by photolithography and etching using a hydrofluoric acid based etchant. It is to be noted that the size of the opening may be changed depending on characteristics of a device to be fabricated.

Figure 2A:
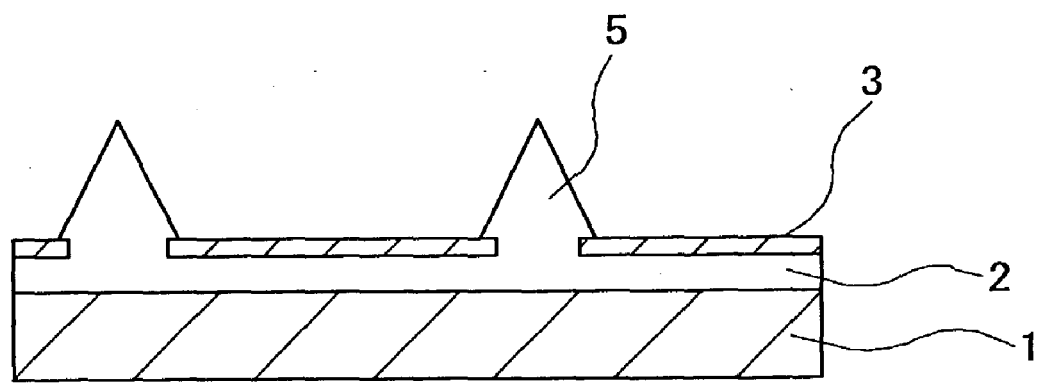
FIGS. 2A and 2B are a sectional view and a perspective view showing a crystal layer forming step in the method of fabricating a semiconductor light emitting device according to the first embodiment of the present invention, respectively.
Figure 2B:
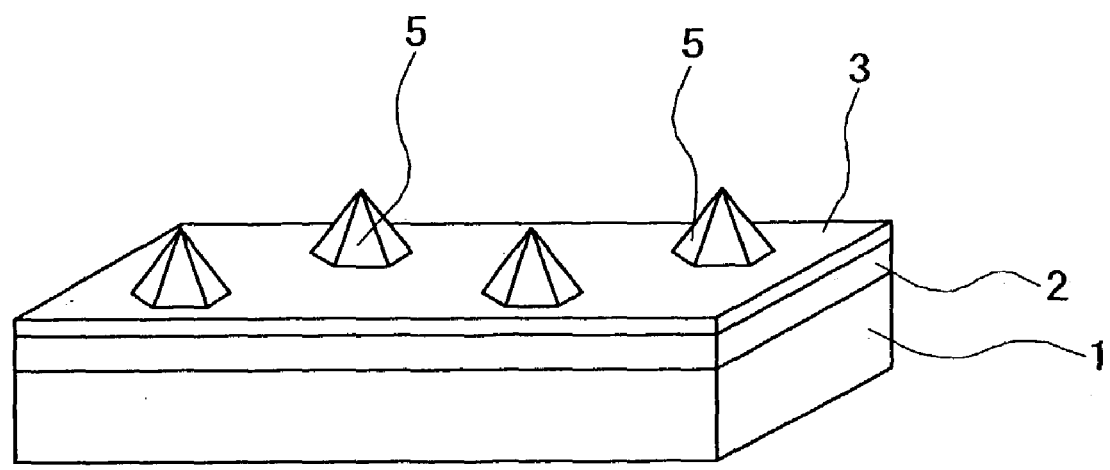

The growth temperature is raised again to 1000° C., and a silicon-doped GaN layer 5 is formed by crystal growth. With respect to crystal growth of the silicon-doped GaN layer 5, the crystal growth begins from each of the circular window regions 4, and after an elapse of certain time, the crystal grown from the window region 4 becomes a hexagonal pyramid shape surrounded by the S-plane, that is, the (1-101) plane. If the growth time is insufficient, the grown crystal is terminated in the form of a hexagonal truncated pyramid shape. In this embodiment, however, after the crystal exhibits a hexagonal pyramid shape, the crystal growth is further continued until the crystal becomes a hexagonal pyramid shape of a size having a width of about 20 μm (length of one side: about 10 μm) and a height of about 16 μm (about 1.6 times the length of one side). In this way, as shown in FIGS. 2A and 2B, the silicon-doped GaN layer 5 with its bottom surface extended outwardly from the window region 4 is formed. To be more specific, with reference to FIG. 2A which shows the cross-section of the silicon-doped GaN layer 5, while the diameter of the opening is 10 μm, the length of the bottom side of the triangular cross-section of the silicon-doped GaN layer becomes about 16 μm. It is to be noted that the size, that is, the width of the hexagonal pyramid shape of the silicon-doped GaN layer 5 is not limited to about 20 μm as described above but may be set to another value, for example, about 10 μm.

Figure 3A:
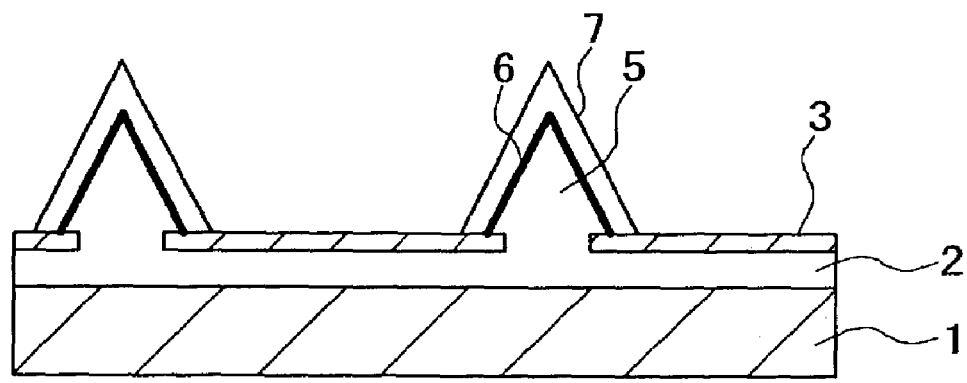
FIGS. 3A and 3B are a sectional view and a perspective view showing an active layer forming step in the method of fabricating a semiconductor light emitting device according to the first embodiment of the present invention, respectively.
Figure 3B:
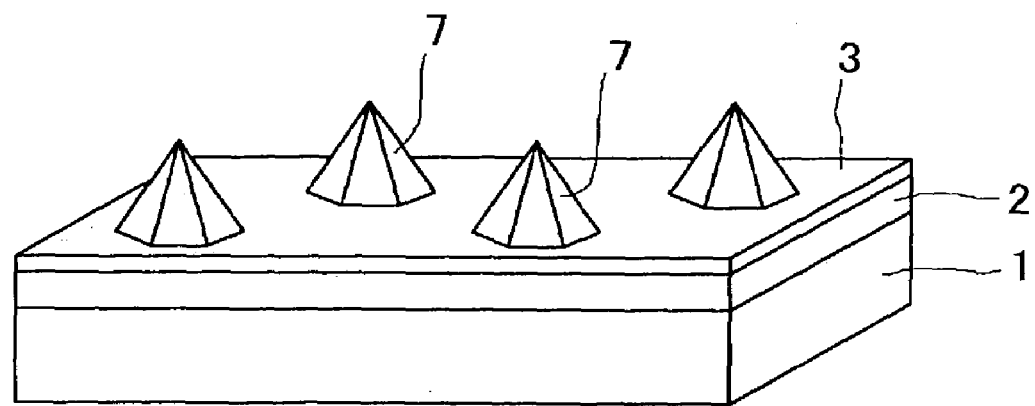

After the crystal growth of silicon-doped GaN is further continued, as shown in FIGS. 3A and 3B, the crystal growth temperature is lowered and an InGaN layer 6 is grown as an active layer on the silicon-doped layer 5, and then the growth temperature is raised again and a magnesium-doped GaN layer 7 is grown as a p-type cladding layer on the InGaN layer 6. The thickness of the InGaN layer 6 is set to a value in a range of about 0.5 nm to 3 nm. The active layer may be configured as a single quantum-well layer or a multi-quantum well made from (Al)GaN/InGaN, or configured to have a multi-structure using GaN or InGaN functioning as a guide layer. In this case, an AlGaN layer is preferably grown directly on the InGaN layer. In this stage, the InGaN layer 6 and the magnesium-doped GaN layer 7 extend to a portion, around the window region 4, of the mask layer 3 in such a manner as to cover the whole of the silicon-doped GaN layer 5 as a second growth layer.

Figure 4A:
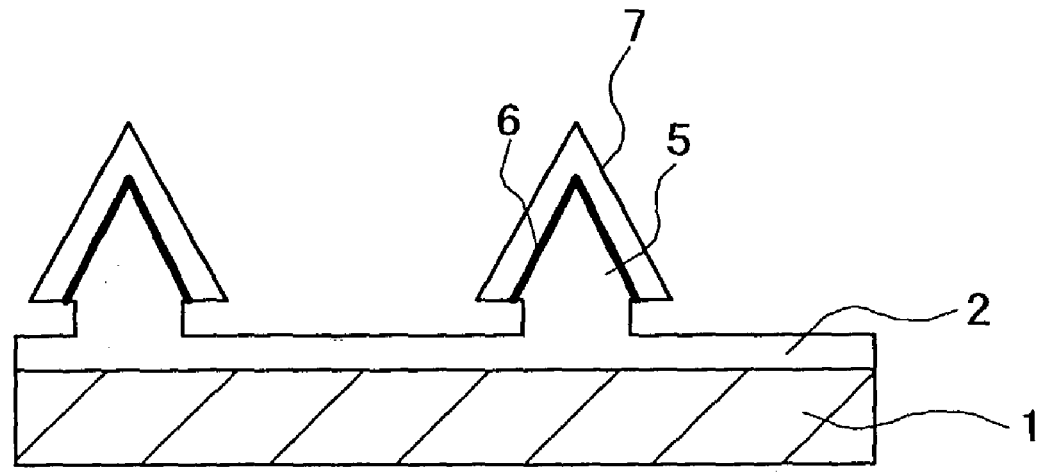
FIGS. 4A and 4B are a sectional view and a perspective view showing a mask layer removing step in the method of fabricating a semiconductor light emitting device according to the first embodiment of the present invention, respectively.
Figure 4B:
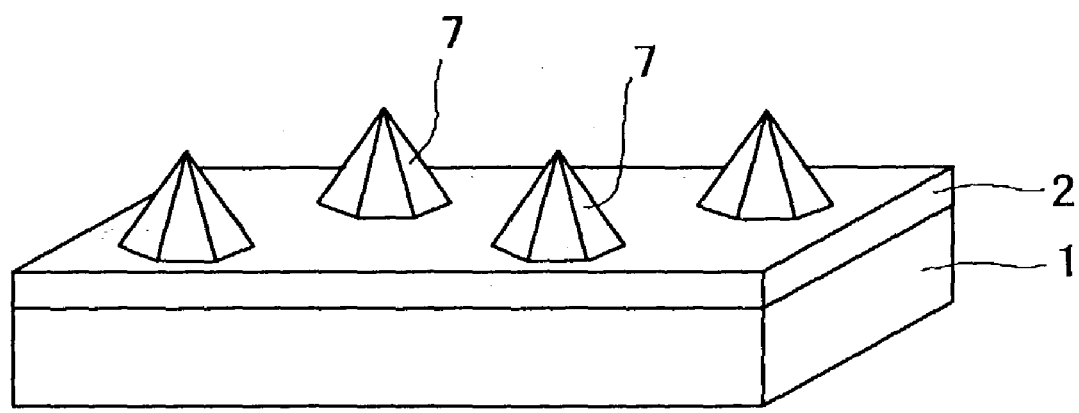

As shown in FIGS. 4A and 4B, the mask layer 3 is removed by a hydrofluoric acid based etchant, to expose the silicon-doped GaN layer 2. The removal of the mask layer 3 is performed to expose the whole of the GaN layer 2 except for each portion on which the hexagonal pyramid shaped GaN layer 5 is formed. In other words, even the portion, located under the laterally grown portion (lower edge portion) of the hexagonal pyramid shaped silicon-doped GaN layer 5, of the mask layer 3 is removed, with a result that a neck portion is formed so as to connect the hexagonal pyramid shaped silicon-doped GaN layer 5 to the silicon-doped GaN layer 2 as shown in FIG. 4A. The neck portion, which is equivalent to that initially grown from the window region 4, of the silicon-doped GaN layer 5 has a shape which projects upwardly from the silicon-doped GaN layer 2 and supports the main hexagonal pyramid shaped portion of the silicon-doped GaN layer 5 on which the InGaN layer 6 and the magnesium-doped GaN layer 7 are stacked.

Figure 5A:
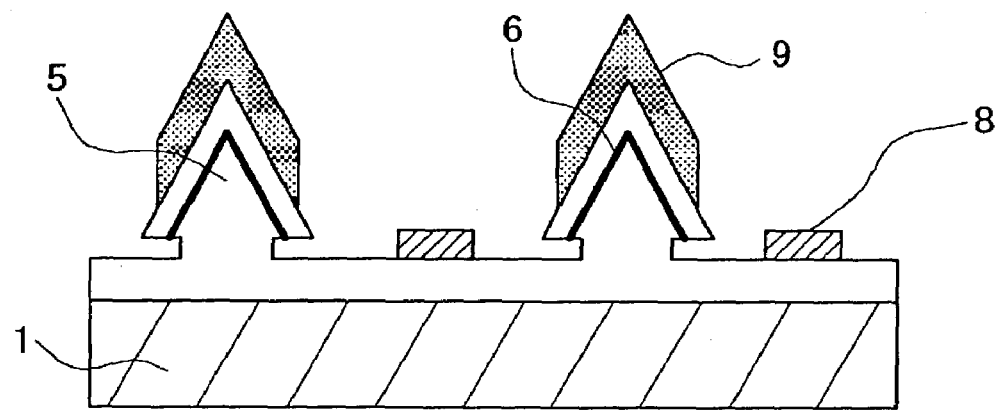
FIGS. 5A and 5B are a sectional view and a perspective view showing an electrode forming step in the method of fabricating a semiconductor light emitting device according to the first embodiment of the present invention, respectively.
Figure 5B:
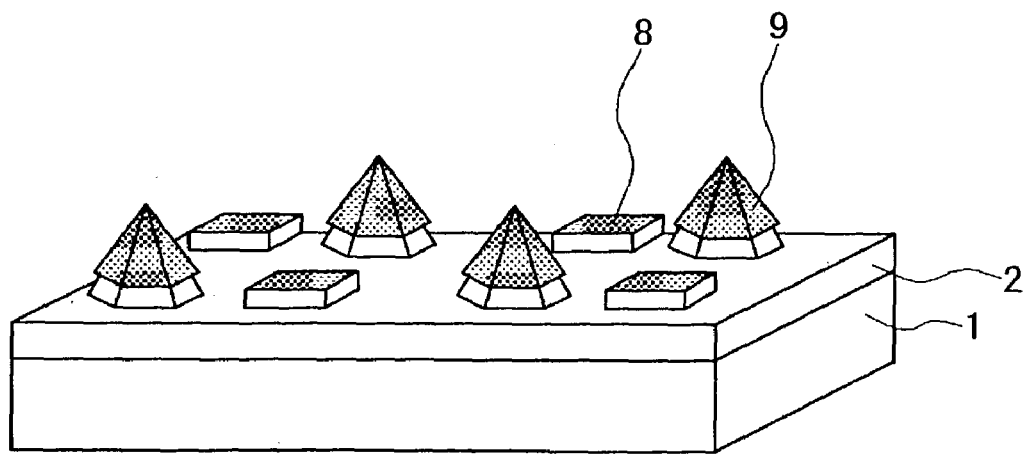

As shown in FIGS. 5A and 5B, after the removal of the mask layer 3, a metal material Ti/Al/Pt/Au is vapor-deposited at a specific position of the silicon-doped GaN layer 2, to form an n-electrode 8. A metal material Ni/Pt/Au or Ni(Pd)/Pt/Au is vapor-deposited on the uppermost layer of the stacked structure grown on the hexagonal pyramid shaped silicon-doped GaN layer 5, to form a p-electrode 9. In this case, it is required to accurately form the p-electrode 9 and the n-electrode 8 by vapor-deposition.

Figure 6A:
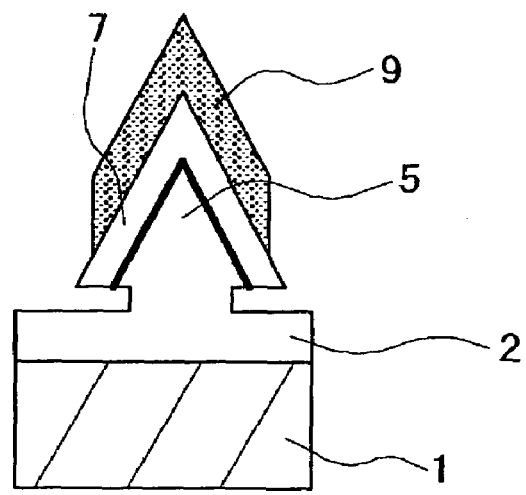
FIGS. 6A and 6B are a sectional view and a perspective view showing a device separating step in the method of fabricating a semiconductor light emitting device according to the first embodiment of the present invention, respectively.
Figure 6B:
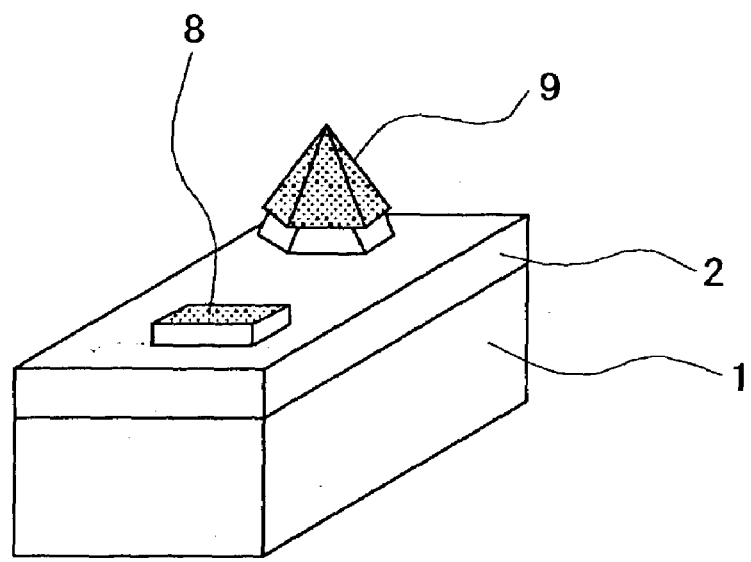

Finally, as shown in FIGS. 6A and 6B, the device structures thus formed are isolated from each other by RIE (Reactive Ion Etching) or by using a dicer, to accomplish semiconductor light emitting devices according to this embodiment.

Figure 7:
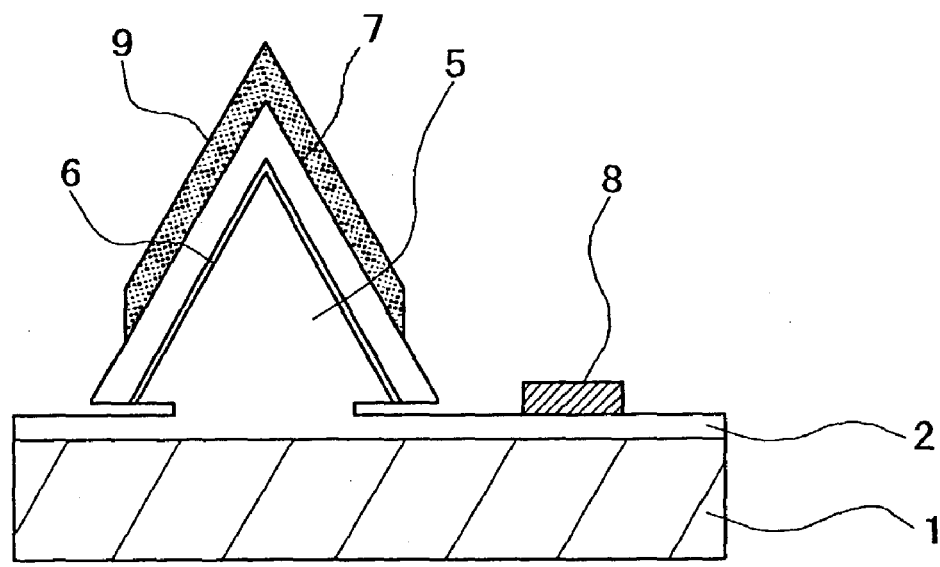
FIG. 7 is a sectional view of a semiconductor light emitting device according to the first embodiment of the present invention.

The semiconductor light emitting device fabricated by the above-described fabrication steps in this embodiment has a device structure shown in FIG. 7. Such a device is mainly configured such that the silicon-doped GaN layer 5 is grown as the second growth layer on the sapphire substrate 1 with the $C^+$-plane taken as the principal plane of the substrate via the silicon-doped GaN layer 2 as a crystal seed layer. The silicon-doped GaN layer 5 has a peripheral plane covered with the S-plane tilted from the principal plane of the substrate, and is formed into the shape having the bottom plane whose area is larger than that of the window region 4 of the removed mask layer 3.

In this device, the InGaN layer 6 as the active layer is formed in such a manner as to extend in parallel to the S-plane of the silicon-doped GaN layer 5, and the magnesium-doped GaN layer 7 as the cladding layer is formed on the InGaN layer 6. The p-electrode 9 is formed on the upper surface of the magnesium-doped GaN layer 7, and the n-electrode 8 is formed in an open region located on a side of the hexagonal pyramid portion in such a manner as to be connected to the silicon-doped GaN layer 5 via the silicon-doped GaN layer 2.

According to the semiconductor light emitting device in this embodiment, since the mask layer 3 having been used for selective growth is removed in the course of fabrication, there can be obtained an advantage that the electrode can be easily formed in the subsequent electrode forming step. Also, by re-growing crystal on the exposed silicon-doped GaN layer 2 after removal of the mask layer 3, it is possible to fabricate devices of different kinds such as a planar type on the same substrate.

Since the S-plane tilted from the principal plane of the substrate is used, the number of bonds from nitrogen atoms to gallium atoms in GaN is increased, with a result that it is possible to increase an effective V/III ratio, and hence to enhance the performance of the semiconductor light emitting device. Since the S-plane is different from the principal plane ($C^+$-plane) of the substrate, dislocations extending upwardly from the substrate may be bent, to reduce crystal defects of the crystal layer formed on the S-plane. Since the tilt crystal plane tilted from the principal plane of the substrate is used, it is possible to prevent multiple reflection of emission light, and hence to efficiently emerge light emitted from the light emission resin to the outside of the device. Further, according to this embodiment, since a current is injected in the active layer having a large area, it is possible to equalize the applied current, avoid concentration of the current, and reduce the current density.

<Embodiment 2>

In this embodiment, the present invention is applied to a semiconductor light emitting device configured by growing a stripe-shaped crystal layer having a triangular cross-section on a substrate. A method of fabricating the semiconductor light emitting device will be described, together with the structure of the semiconductor light emitting device, with reference to FIGS. 8 to 12.

Figure 8:
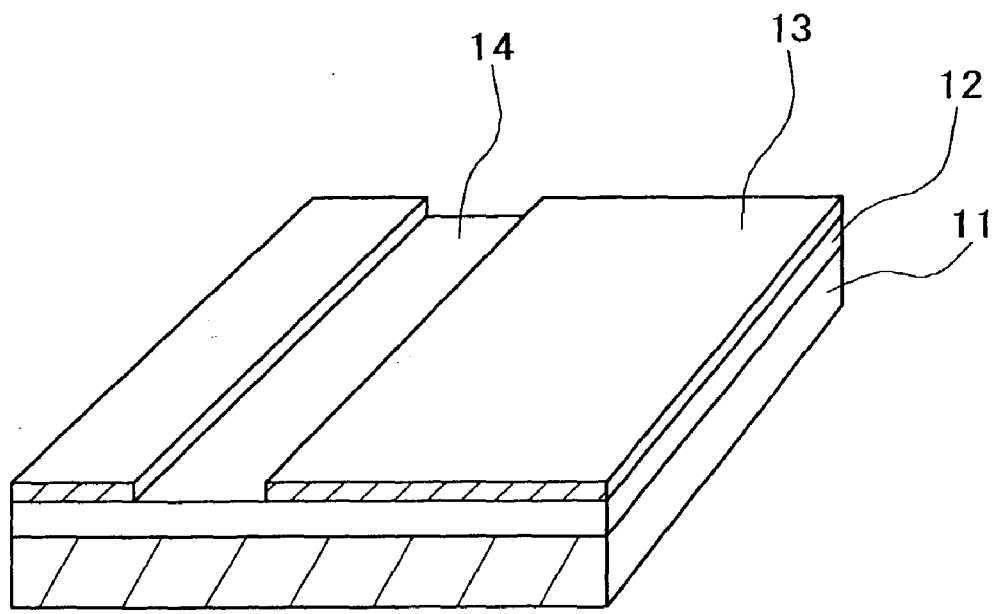
FIG. 8 is a sectional view showing a mask forming step in a method of fabricating a semiconductor light emitting device according to a second embodiment of the present invention.
Figure 9:
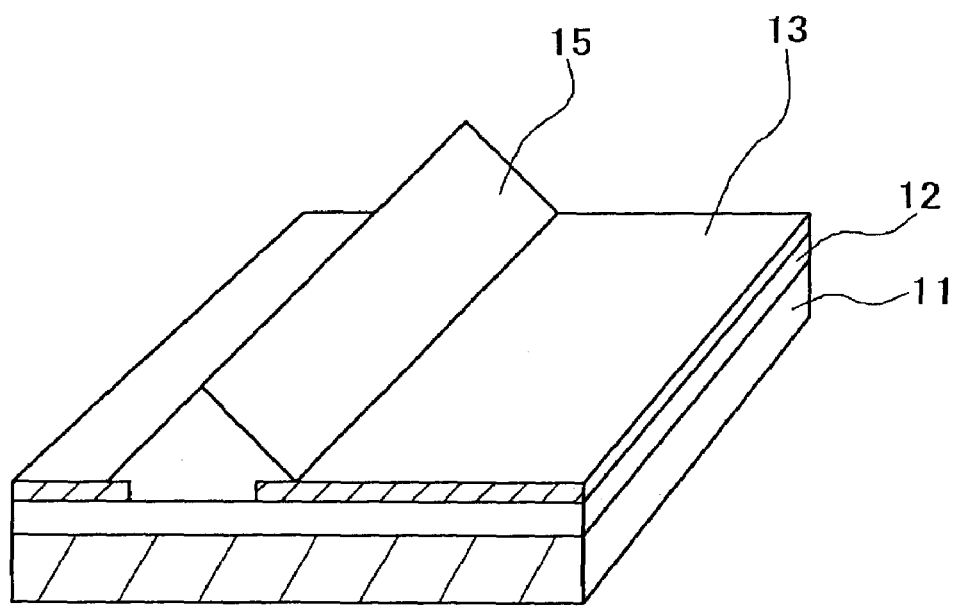
FIG. 9 is a sectional view showing a crystal layer forming step in the method of fabricating a semiconductor light emitting device according to the second embodiment of the present invention.

Like the initial step of Embodiment 1, a low-temperature buffer layer is formed on a sapphire substrate 11 with the $C^+$-plane taken as the principal plane of the substrate, and the growth temperature is raised to 1000° C., at which a silicon-doped GaN layer 12 is formed as a first growth layer on the low-temperature buffer layer. A mask layer 13 made from $SiO_2$ or SiN is formed overall on the silicon-doped GaN layer 12 to a thickness ranging from 100 to 500 nm, and as shown in FIG. 8, a window region 14 composed of a stripe-shaped opening is formed in the mask layer 13 by photolithography and etching using a hydrofluoric acid based etchant.

The growth temperature is raised again to 1000° C. at which a silicon-doped GaN layer 15 is formed by crystal growth. In this growth step, crystal growth begins from the stripe-shaped window region 14, and after an elapse of certain time, the crystal becomes a triangular shape in cross-section. In this way, the silicon-doped GaN layer 15 with the bottom surface extending outwardly from the window region 14 is formed. It is to be noted that if the growth time is insufficient, the GaN layer 15 becomes a truncated triangular prism shape.

Figure 10:
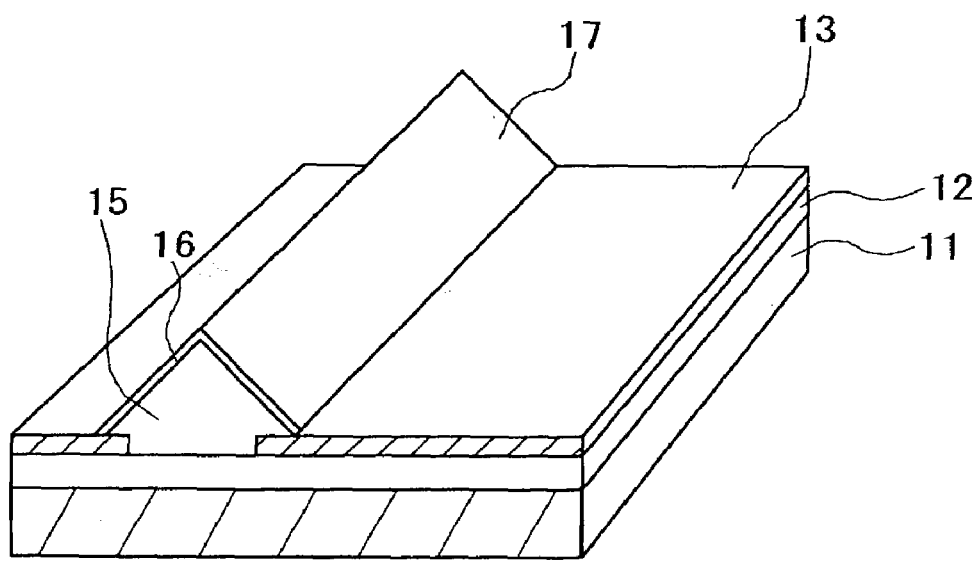
FIG. 10 is a sectional view showing an active layer forming step in the method of fabricating a semiconductor light emitting device according to the second embodiment of the present invention.

After the silicon-doped GaN layer is further grown, as shown in FIG. 10, the growth temperature is lowered and an InGaN layer 16 is grown as an active layer on the GaN layer 15, and then the growth temperature is raised again and a magnesium-doped GaN layer 17 is grown as a p-type cladding layer. In this case, the thickness of the InGaN layer 16 is set to be in a range of about 0.5 nm to 3 nm. The active layer may be configured as a single quantum-well layer or a multi-quantum well made from (Al)GaN/InGaN, or configured to have a multi-structure using GaN or InGaN functioning as a guide layer. In this case, an AlGaN layer is preferably grown directly on the InGaN layer. In this stage, the InGaN layer 16 and the magnesium-doped GaN layer 17 extend to a portion, around the window region 14, of the mask layer 13 in such a manner as to cover the whole of the silicon-doped GaN layer 15 as a second growth layer.

Figure 11:
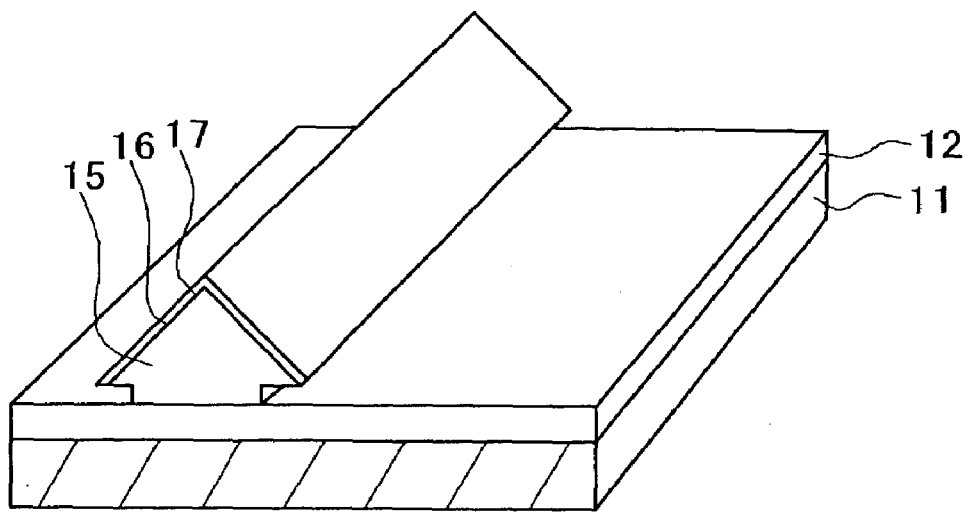
FIG. 11 is a sectional view showing a mask layer removing step in the method of fabricating a semiconductor light emitting device according to the second embodiment of the present invention.

As shown in FIG. 11, the mask layer 13 is removed by a hydrofluoric acid based etchant, to expose the silicon-doped GaN layer 12. The removal of the mask layer 13 is performed to expose the whole of the GaN layer 12 except for each portion on which the triangular prism shaped GaN layer 15 is formed. In other words, even the portion, located under the laterally grown portion (lower edge portion) of the triangular prism shaped silicon-doped GaN layer 15, of the mask layer 13 is removed, with a result that a neck portion is formed so as to connect the triangular prism shaped silicon-doped GaN layer 15 to the silicon-doped GaN layer 12 as shown in FIG. 11. The neck portion, which is equivalent to that initially grown from the window region 14, of the silicon-doped GaN layer 15 has a shape which projects upwardly from the silicon-doped GaN layer 12 and supports the main triangular prism shaped portion of the silicon-doped GaN layer 15 on which the InGaN layer 16 and the magnesium-doped GaN layer 17 are stacked.

Figure 12:
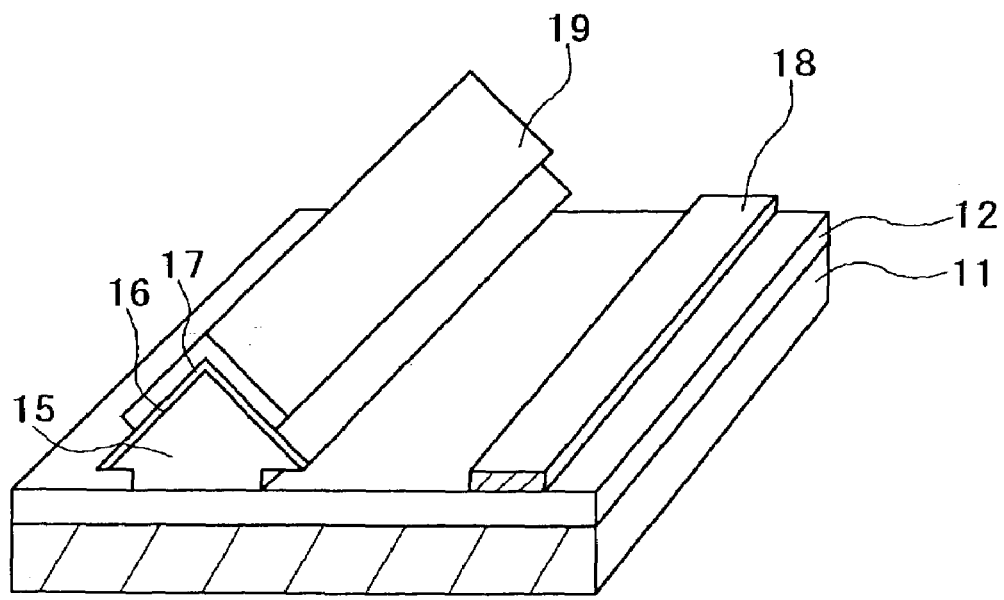
FIG. 12 is a sectional view showing an electrode forming step in the method of fabricating a semiconductor light emitting device according to the second embodiment of the present invention.

As shown in FIG. 12, after the removal of the mask layer 13, a metal material Ti/Al/Pt/Au is vapor-deposited in a stripe shape at a specific position of the silicon-doped GaN layer 12, to form an n-electrode 18. A metal material Ni/Pt/Au or Ni(Pd)/Pt/Au is vapor-deposited on the uppermost layer of the stacked structure grown on the triangular prism shaped silicon-doped GaN layer 15, to form a p-electrode 19. In this case, it is required to accurately form the p-electrode 19 and the n-electrode 18 by vapor-deposition. A light emitting device according to this embodiment is thus accomplished.

As shown in FIG. 12, the semiconductor light emitting device according to this embodiment fabricated by the above-described fabrication steps is configured such that the silicon-doped GaN layer 15 is grown as the second growth layer on the sapphire substrate 11 with the $C^+$-plane taken as the principal plane of the sapphire substrate 11 via the silicon-doped GaN layer 12 as the crystal seed layer. The silicon-doped GaN layer 15 has a peripheral plane tilted from the principal plane of the substrate. To be more specific, in the silicon-doped GaN layer 15, the tilt peripheral plane is taken as the S-plane, and the end plane in the longitudinal direction is taken as the (11-22) plane.

According to this embodiment, the InGaN layer 16 as the active layer is formed in the shape extending in parallel to the S-plane, and the magnesium-doped GaN layer 17 is formed as the cladding layer on the InGaN layer 16. The p-electrode 19 is formed on the upper surface of the magnesium-doped GaN layer 17, and the n-electrode 18 is formed in an open region on a side of the triangular prism shaped portion in such a manner as to be connected to the silicon-doped GaN layer 15 via the silicon-doped GaN layer 12.

According to the semiconductor light emitting device in this embodiment, since the mask layer 13 having been used for selective growth is removed in the course of fabrication, there can be obtained an advantage that the electrode can be easily formed in the subsequent electrode forming step. Also, by re-growing crystal on the exposed silicon-doped GaN layer 12 after removal of the mask layer 13, it is possible to fabricate devices of different kinds such as a planar type on the same substrate.

<Embodiment 3>

In this embodiment, an image display unit is formed by using the semiconductor light emitting devices fabricated in Embodiment 1. The structure of such an image display unit will be described with reference to FIG. 13.

Figure 13:
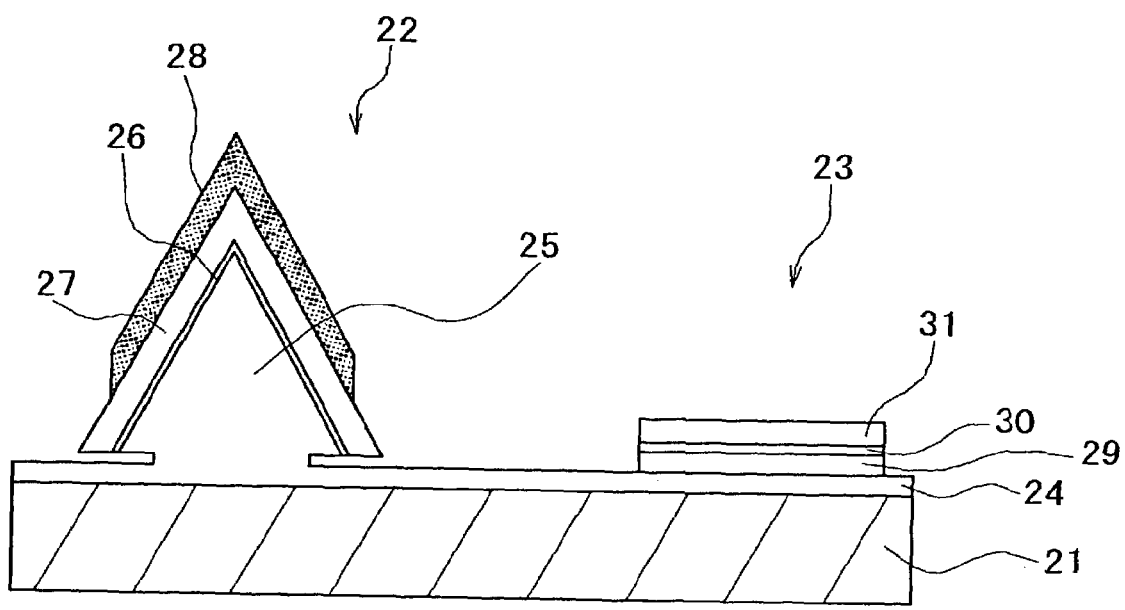
FIG. 13 is a sectional view showing a semiconductor light emitting device according to a third embodiment of the present invention.

An image display unit shown in FIG. 13 includes a hexagonal pyramid shaped semiconductor light emitting device 22 formed by the same fabrication steps as those in Embodiment 1, and a planar type semiconductor light emitting device 23 formed after formation of the hexagonal pyramid shaped semiconductor light emitting device 22. It is to be noted that in FIG. 13, the n-electrode 8 of the hexagonal pyramid shaped semiconductor light emitting device is not shown, and a p-electrode and an n-electrode of the planar type semiconductor light emitting device 23 are not shown.

The hexagonal pyramid shaped semiconductor light emitting device 22 has a silicon-doped GaN layer 25 as a second growth layer selectively grown on a sapphire substrate 21 with the $C^+$-plane taken as the principal plane of the substrate on a silicon-doped GaN layer 24 as a crystal seed layer. The silicon-doped GaN layer 25 has a peripheral plane surrounded by the S-plane tilted from the principal plane of the substrate, and has a bottom surface having an area larger than that of a window region formed in a mask layer removed after formation of the GaN layer 25.

In the hexagonal pyramid shaped semiconductor light emitting device 22, an InGaN layer 26 is formed as an active layer on the silicon-doped GaN layer 25 in such a manner as to extend in parallel to the S-plane, and a magnesium-doped GaN layer 27 is formed as a cladding layer on the InGaN layer 26. A p-electrode 28 is formed on the upper surface of the magnesium-doped GaN layer 27.

The planar type semiconductor light emitting device 23 shown in FIG. 13 is configured such that crystal layers are re-grown on the silicon-doped GaN layer 24 exposed after the hexagonal pyramid shaped semiconductor light emitting device 22 is formed. To be more specific, the planar type semiconductor light emitting device 23 is configured by stacking, on the sapphire substrate 21, a silicon-doped GaN layer 29 as a second growth layer grown via the silicon-doped GaN layer 24, an InGaN layer 30 as an active layer, and magnesium-doped GaN layer 31 as a cladding layer in this order.

In the case of re-growing the silicon-doped GaN layer 29 as a second growth layer on the exposed GaN layer 24 after removal of the mask layer, since GaN less adheres on the exposed GaN layer 24 at the beginning of crystal growth, it is preferred to grow the GaN layer 29 for a sufficiently prolonged growth time or at a low growth temperature.

By re-using the substrate after removal of the mask layer, it is possible to form semiconductor light emitting devices of different kinds on the same substrate, and by arraying these semiconductor light emitting devices such that the devices emit light in response to signals, it is possible to provide an image display unit having a new structure.

In this embodiment, as shown in FIG. 13, another kind of semiconductor light emitting device to be formed by re-growth is configured as the GaN based semiconductor light emitting device 23; however, it is not limited thereto but may be any other semiconductor light emitting device in terms of kind and shape.

According to the semiconductor light emitting device and the fabrication method thereof, since the tilt crystal plane tilted from the principal plane of the substrate is used, it is possible to increase an effective V/III ratio, to increase the degree of incorporation of atoms of a mixed crystal, and to reduce unevenness of light emission. It is also possible to suppress dissociation of nitrogen atoms, and to improve the crystallinity and hence to reduce concentration of point defects. This is advantageous in suppressing a phenomenon that luminance is saturated when a strong current is applied to the light emitting device.

Since the tilt plane tilted from the principal plane of the substrate is used, it is possible to prevent multiple reflection of emission light, and hence to efficiently emerge light emitted from a light emission region to the outside of the device. Since the mask is removed after growth of the crystal layer and the like, it is possible to easily form the electrode and avoid an inconvenience due to deposition of polycrystal, and hence to enhance the performance of the semiconductor light emitting device.

According to the present invention, it is possible to realize a high luminance image display unit having a new structure by using the above-described semiconductor light emitting device.

While the preferred embodiments of the present invention have been described using the specific terms, such description is for illustrative purposes only, and it is to be understood that changes and variations may be made without departing from the spirit and the scope of the following claims.

What is claimed is:

1. A method of fabricating a semiconductor light emitting device, comprising the steps of:
   providing a substrate wherein the principal plane of said substrate is a c-plane;
   forming a mask as a layer over the substrate and forming at least one opening in the mask layer;
   forming a crystal layer having a crystal plane tilted from a principal plane of a layer exposed by said opening, the crystal layer being formed by selective growth from said opening of said mask, and forming, over said crystal layer, a first conductive type layer, an active layer; and a second conductive type layer, which extend in planes parallel to said crystal plane;
   wherein said crystal plane includes at least one of a S-plane and a (11-22) plane, and thereafter removing said mask.

2. A method of fabricating a semiconductor light emitting device according to claim 1, wherein the removal of said mask is performed by etching.

3. A method of fabricating a semiconductor light emitting device according to claim 2, wherein said etching is performed by using a hydrofluoric acid based etchant.

4. A method of fabricating a semiconductor light emitting device according to claim 1, wherein said crystal layer has a wurtzite type crystal structure.

5. A method of fabricating a semiconductor light emitting device according to claim 1, wherein an underlying growth layer is formed on said substrate, and said mask is formed on said underlying growth layer.

6. A method of fabricating a semiconductor light emitting device according to claim 1, wherein said crystal layer is formed by selective growth in such a manner as to extend outwardly from said opening of said mask in the lateral direction, and wherein the crystal layer partially overlays the mask.

7. A method of fabricating a semiconductor light emitting device according to claim 1, wherein said crystal plane has six plane portions which are nearly symmetrically disposed.

8. A method of fabricating a semiconductor light emitting device according to claim 1, wherein said crystal plane constitutes plane of an approximately hexagonal pyramid shape.

9. A method of fabricating a semiconductor light emitting device according to claim 1, wherein said crystal layer has a flat plane composed of the C-plane at an approximately central portion on the side opposed to the principal plane of said layer exposed by the opening.

10. A method of fabricating a semiconductor light emitting device according to claim 1, wherein said crystal layer is made from a nitride semiconductor.

11. A method of fabricating a semiconductor light emitting device according to claim 1, wherein said active layer is made from InGaN.

12. A method of fabricating a semiconductor light emitting device according to claim 1, wherein after said mask is removed, another semiconductor light emitting device is formed on said substrate.

13. A method of fabricating a semiconductor light emitting device, comprising the steps of:

provideng a substrate wherein the principal plane of said substrate is a c-plane;

forming a mask as a layer over the substrate and forming at least one opening in the mask layer;

forming a crystal layer having a crystal plane tilted from a principal plane of a layer exposed by said opening, the crystal layer being formed by selective growth from said opening of said mask, and forming, over said crystal layer, a first conductive type layer, an active layer, and a second conductive type layer, with extend in planes parallel to said crystal plane;

wherein said crystal plane includes at least one of a S-plane and a (11-22) plane, and thereafter removing said mask, and wherein said mask is made from $SiO_2$ or SiN.

* * * * *